(12) United States Patent
Teshigahara et al.

(10) Patent No.: US 12,354,875 B2
(45) Date of Patent: Jul. 8, 2025

(54) ELEMENT FORMING WAFER AND METHOD FOR MANUFACTURING THE SAME

(71) Applicant: DENSO CORPORATION, Kariya (JP)

(72) Inventors: Akihiko Teshigahara, Kariya (JP); Megumi Suzuki, Kariya (JP)

(73) Assignee: DENSO CORPORATION, Kariya (JP)

( * ) Notice: Subject to any disclaimer, the term of this patent is extended or adjusted under 35 U.S.C. 154(b) by 548 days.

(21) Appl. No.: 17/732,688

(22) Filed: Apr. 29, 2022

(65) Prior Publication Data

US 2022/0254637 A1   Aug. 11, 2022

Related U.S. Application Data

(63) Continuation of application No. PCT/JP2020/042980, filed on Nov. 18, 2020.

(30) Foreign Application Priority Data

Nov. 20, 2019   (JP) .................................. 2019-209854

(51) Int. Cl.
*H01L 21/266*   (2006.01)
*H01L 21/78*   (2006.01)
*H10N 30/074*   (2023.01)
*H10N 39/00*   (2023.01)

(52) U.S. Cl.
CPC ............ *H01L 21/266* (2013.01); *H01L 21/78* (2013.01); *H10N 30/074* (2023.02); *H10N 39/00* (2023.02)

(58) Field of Classification Search
CPC .............................................. H10N 30/00–886
See application file for complete search history.

(56) References Cited

U.S. PATENT DOCUMENTS 5,922,212 A   7/1999 Kano et al.

FOREIGN PATENT DOCUMENTS

| JP | H7-78754 A | 3/1995 |
|----|------------|--------|
| JP | 2009-277909 A | 11/2009 |
| JP | 2013-050673 A | 3/2013 |
| JP | 2013-156102 A | 8/2013 |
| JP | 2014-179572 A | 9/2014 |

*Primary Examiner* — Laura M Menz
*Assistant Examiner* — Candice Chan
(74) *Attorney, Agent, or Firm* — POSZ LAW GROUP, PLC (57) ABSTRACT

A method for manufacturing an element forming wafer includes the steps of: forming a thin layer on a semiconductor wafer having a plurality of chip forming regions; and adjusting stress generated in an element forming portion of the thin layer to have a specified value. The thin layer constitutes an element in each of the plurality of chip forming regions. The step of adjusting the stress includes: arranging a resist on the thin layer; exposing the resist to light using a photomask having openings; forming openings in the resist by developing the resist; and performing ion-implantation using the resist as a mask. The photomask used during the step of exposing the resist to light has a ratio of the openings that is adjusted based on the stress generated in the element forming portion.

2 Claims, 10 Drawing Sheets

ELEMENT FORMING WAFER AND METHOD FOR MANUFACTURING THE SAME

CROSS REFERENCE TO RELATED APPLICATION

This application is a continuation application of International Patent Application No. PCT/JP2020/042980 filed on Nov. 18, 2020, which designated the U.S. and claims the benefit of priority from Japanese Patent Application No. 2019-209854 filed on Nov. 20, 2019. The entire disclosure of all of the above application is incorporated herein by reference.

TECHNICAL FIELD

The present disclosure relates to an element forming wafer in which a thin layer is formed on a semiconductor wafer and a method for manufacturing the same.

BACKGROUND ART

Conventionally, an element forming wafer in which a thin layer is formed on a semiconductor wafer has been proposed. In such an element forming wafer, stress generates during process of forming a thin layer. The stress generates unevenly in an in-plane direction of the thin layer. In view of the above, a method for equalizing the stress generated in the thin layer by implanting ions according to the stress of the thin layer has been known. Specifically, the stress in an element forming portion constituting an element in the thin layer is equalized by performing ion implantation. In this method, when ion implantation is performed, the stress in the thin layer is made uniform by adjusting an amount of ions to be implanted by changing emission time of an ion beam or by changing an ion current density of the ion beam.

SUMMARY

According to one aspect of the present disclosure, a method is for manufacturing an element forming wafer having a semiconductor wafer and a thin layer formed on the semiconductor wafer. The method includes the steps of: forming the thin layer on the semiconductor wafer having a plurality of chip forming regions; and adjusting stress generated in an element forming portion of the thin layer to have a specified value. The thin layer constitutes an element in each of the plurality of chip forming regions. The step of adjusting the stress includes: arranging a resist on the thin layer; exposing the resist to light using a photomask having openings; forming openings in the resist by developing the resist; and performing ion-implantation using the resist as a mask. The photomask used during the step of exposing the resist to light has a ratio of the openings that is adjusted based on the stress generated in the element forming portion.

DESCRIPTION OF EMBODIMENTS

To begin with, a relevant technology will be described first only for understanding the following embodiments.

In the above-mentioned conventional method for manufacturing an element forming wafer, detailed control is required when emitting an ion beam, and thus the manufacturing process tends to be complicated.

It is one objective of the present disclosure to provide an element forming wafer and a method for manufacturing the same where stress generated in a thin layer can be controlled to have a desired value, while simplifying the manufacturing process.

As described above, according to the one aspect of the present disclosure, a method is for manufacturing an element forming wafer having a semiconductor wafer and a thin layer formed on the semiconductor wafer. The method includes the steps of: forming the thin layer on the semiconductor wafer having a plurality of chip forming regions; and adjusting stress generated in an element forming portion of the thin layer to have a specified value. The thin layer constitutes an element in each of the plurality of chip forming regions. The step of adjusting the stress includes: arranging a resist on the thin layer; exposing the resist to light using a photomask having openings; forming openings in the resist by developing the resist; and performing ion-implantation using the resist as a mask. The photomask used during the step of exposing the resist to light has a ratio of the openings that is adjusted based on the stress generated in the element forming portion.

Accordingly, by changing the opening ratio of the photomask, the stress in the element forming portion in each chip forming region can be controlled to have a desired value. Therefore, it is not necessary to finely control an exposure time and the like at the time of ion implantation, and thus the manufacturing process can be simplified.

According to a second aspect of the present disclosure, an element forming wafer including: a semiconductor wafer having a plurality of chip forming regions; and a thin layer formed on the semiconductor wafer. A plurality of portions of the thin layer each of which forms an element in each of the plurality of chip forming portions are defined as a plurality of element forming portions. A plurality of regions are formed in the thin layer in one direction that passes through a center of the semiconductor wafer and that extends along an in-plane direction of the semiconductor wafer. Each of the plurality of element forming portions is arranged in a respective one of the plurality of regions. A stress distribution that is along the one direction and is generated across the plurality of element forming portions has a maximum and a minimum of the stress in each of the plurality of regions. A rate of change in the stress between the maximum and the minimum in each of the plurality of regions is smaller than a rate of change in the stress at a boundary between adjacent ones of the plurality of regions.

Such an element forming wafer is formed by ion implantation in which the opening ratio of the photomask is adjusted, and thus it is not necessary to control emission time or the like at the timing of implanting ions. Therefore, the manufacturing process can be simplified.

Hereinafter, embodiments of the present disclosure will be described with reference to the drawings. In each embodiment described below, same or equivalent parts are designated with the same reference numerals.

First Embodiment

A first embodiment will be described with reference to the drawings. In this embodiment, an ultrasonic sensor formed by a method for manufacturing an element-forming wafer will be described as an example. First, the configuration of the ultrasonic sensor will be described.

Figure 1:
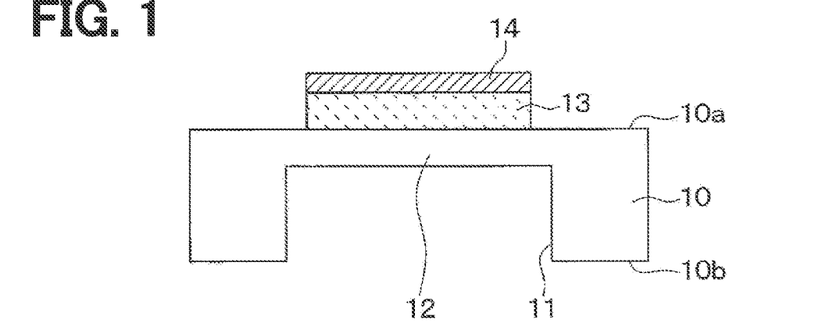
FIG. 1 is a cross-sectional view of an ultrasonic sensor according to a first embodiment.

As shown in FIG. 1, the ultrasonic sensor includes a semiconductor substrate 10 such as silicon having one surface 10a and the other surface 10b. A diaphragm portion 12 is formed in the semiconductor substrate 10 by forming a recess 11. A piezoelectric film 13 and an electrode film 14 are sequentially formed on the diaphragm portion 12.

The diaphragm portion 12 in the present embodiment has a circular, planar shape and its diameter is about 1 mm. The piezoelectric film 13 is made of, for example, piezoelectric ceramics such as aluminum nitride (hereinafter, also referred to as AlN), scandium nitride (hereinafter, also referred to as ScAlN), lead zirconate titanate (PZT), and the like. Further, the piezoelectric film 13 has a circular, planar shape, a diameter equal to that of the diaphragm portion 12, and a film thickness of about 1 μm. Although not particularly illustrated, a wiring pattern electrically connected to the electrode film 14, a pad portion connecting between the wiring pattern and an external circuit, a protective film, and the like are formed on the semiconductor substrate 10.

This ultrasonic sensor can be used for, e.g., transmitters and receivers. For example, when the ultrasonic sensor is used as a transmitter, a predetermined voltage is applied to the electrode film 14, and thus the piezoelectric film 13 vibrates. As a result, the diaphragm portion 12 vibrates. As a result, the ultrasonic sensor transmits transmission waves. Further, for example, when an ultrasonic sensor is used as a receiver, the diaphragm portion 12 vibrates according to received waves, and thus a voltage depending on vibrations generates in the piezoelectric film 13. As a result, the ultrasonic sensor outputs detection signals based on the received waves.

The above is the configuration of the ultrasonic sensor in this embodiment. Next, a method for manufacturing the ultrasonic sensor will be described.

Figure 2A:
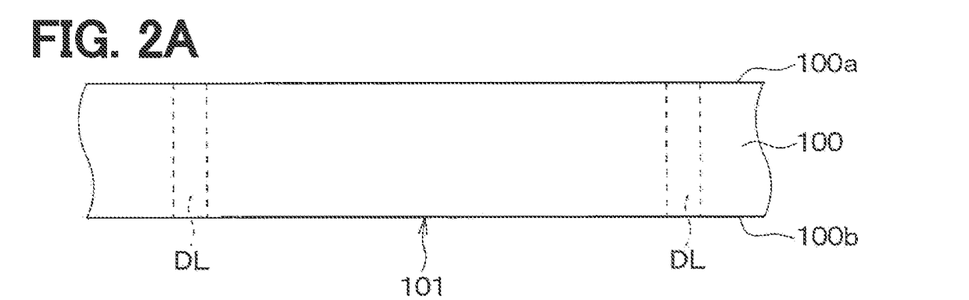
FIG. 2A is a sectional view showing a manufacturing process for the ultrasonic sensor shown in FIG. 1.

First, as shown in FIG. 2A, a semiconductor wafer 100 in which a plurality of chip forming regions 101 are defined by dicing lines DL is prepared. The semiconductor wafer 100 has one surface 100a and the other surface 100b. The semiconductor wafer 100 is, for example, a silicon wafer.

Figure 2B:
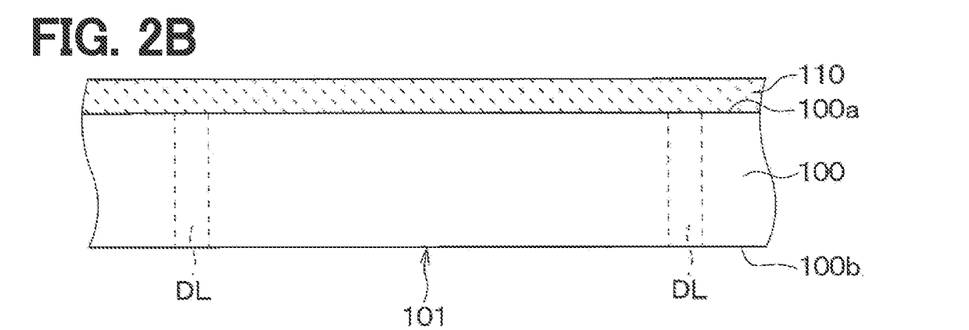
FIG. 2B is a cross-sectional view showing a manufacturing process for the ultrasonic sensor following FIG. 2A.

Next, as shown in FIG. 2B, a piezoelectric layer 110 is formed on the one surface 100a of the semiconductor wafer 100 by a sputtering method or the like. The piezoelectric layer 110 constitutes the piezoelectric film 13 by being patterned, and is formed of the above-described piezoelectric ceramics and the like. The piezoelectric layer 110 is formed on over the entire area of both the chip forming regions 101 and the dicing lines DL. Further, in the present embodiment, the piezoelectric layer 110 corresponds to a thin layer.

In this case, stress generates in the piezoelectric layer 110 depending on a film forming device that forms the piezoelectric layer 110, film forming conditions, and the like. Further, this stress does not uniformly generate in an in-plane direction of the piezoelectric layer 110. That is, stress ununiformly generates in the piezoelectric layer 110 in the in-plane direction. For example, when the piezoelectric layer 110 is formed on the semiconductor wafer 100 having a diameter of 6 inches using a conventional film forming device, a stress distribution with a difference of about several tens to 100 MPa between the maximum value and the minimum value is formed in the piezoelectric layer 110. Therefore, in the present embodiment, the stress distribution in the piezoelectric layer 110 has been calculated in advance by using a variety of film forming devices for forming the piezoelectric layer 110 and by changing film forming conditions.

Thereafter, stress adjustment is performed so as to adjust the stress in the piezoelectric layer 110 to have a desired value (that is, a specified value). Hereinafter, each step of the stress adjustment process will be described. In the following, an example where the stress is generated uniformly by reducing the stress difference in the piezoelectric layer 110 will be described.

Figure 2C:
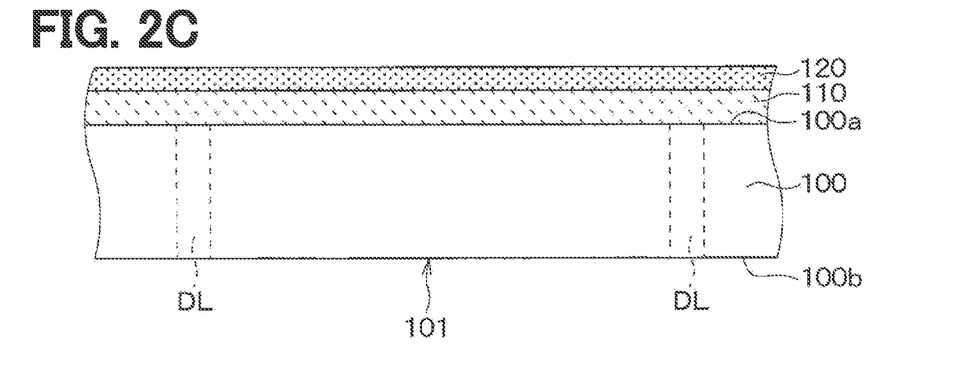
FIG. 2C is a cross-sectional view showing a manufacturing process for the ultrasonic sensor following FIG. 2B.

First, as shown in FIG. 2C, a resist 120 is placed on the piezoelectric layer 110. In this embodiment, the resist 120 is a positive type. However, the resist 120 may be a negative type.

Figure 2D:
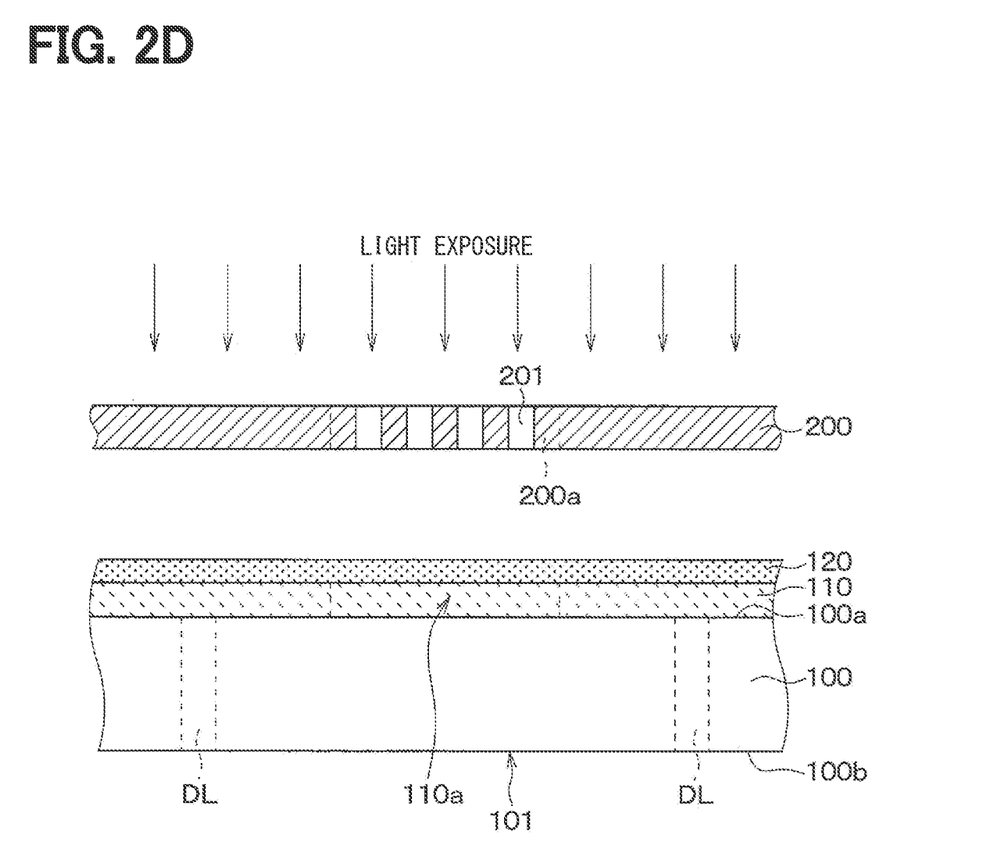
FIG. 2D is a cross-sectional view showing a manufacturing process for the ultrasonic sensor following FIG. 2C.

Next, as shown in FIG. 2D, a photomask 200 with a plurality of openings 201 is placed on the resist 120. Here, a portion of the piezoelectric layer 110 that is to be the piezoelectric film 13 by being patterned is referred to as a piezoelectric film forming portion 110a, and a portion of the photomask 200 that adjusts an amount of light exposure to the resist 120 located on the piezoelectric film forming portion 110a is referred to as an exposure adjustment portion 200a. In this embodiment, since the piezoelectric film 13 has a circular shape, the piezoelectric film forming portion 110a and the exposure adjustment portion 200a also have a circular shape.

Figure 3:
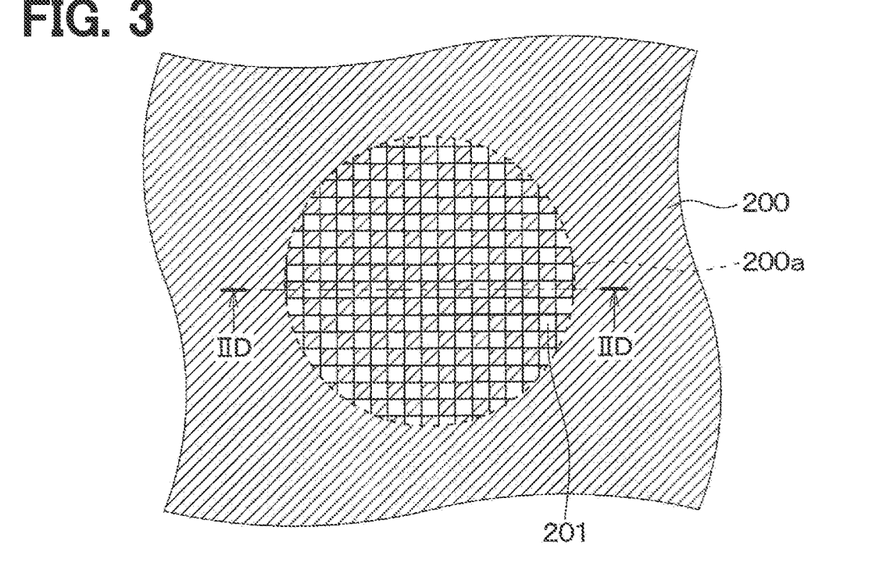
FIG. 3 is a plan view of a photomask in the process of FIG. 2D.

In the present embodiment, as shown in FIG. 3, the openings 201 are formed in the exposure adjustment portion 200a to form a dot-shaped dither pattern. The photomask 200 in FIG. 2D corresponds to a cross-section taken along the line IID-IID in FIG. 3, but the number of openings 201 in FIG. 2D is reduced and width of each of the openings 201 in FIG. 2D is widened as compared to FIG. 3 for easier understanding the structure of the opening 201. Further, although FIG. 3 does not show a cross-sectional view, hatching is applied to a portion different from the openings 201 of the photomask 200 for easy understanding purposes.

Then, the ratio of the region where the openings 201 are formed to the entire region of the exposure adjustment portion 200a is defined as an opening ratio of the exposure adjustment portion 200a. In this case, the opening ratio of the exposure adjustment portion 200a is adjusted according to the stress distribution in the piezoelectric layer 110. For example, it is assumed that tensile stress generates entirely over the piezoelectric layer 110. The opening ratio of the exposure adjustment portion 200a that adjusts, based on the stress distribution of the tensile stress, a light exposure amount for a portion of the resist 120 that is positioned on a portion of the piezoelectric film forming portion 110a where greater tensile stress generates is set as follows. That is, the opening ratio is set to be greater than the opening ratio of the exposure adjustment portion 200a that adjusts a light exposure amount for a portion of the resist 120 located on a portion of the piezoelectric film forming portion 110a where smaller tensile stress generates. That is, when the resist 120 is exposed, the opening ratio of the exposure adjustment portion 200a is adjusted as follows. The opening ratio of the exposure adjustment portion 200a is adjusted such that a portion of the resist 120 located on the portion the piezoelectric film forming portion 110a where greater tensile stress generates has a larger exposed area than a portion of the resist 120 located on the portion of the piezoelectric film forming portion 110a where smaller tensile stress generates. The photomask 200 has been prepared in advance based on the stress distribution in the piezoelectric layer 110 according to types of film forming devices, film forming conditions, and the like.

Then, using the above-described photomask 200, the resist 120 is subjected to aligner exposure (that is, batch exposure) in the present embodiment. In this embodiment, the piezoelectric film forming portion 110a corresponds to an element forming portion.

Figure 2E:
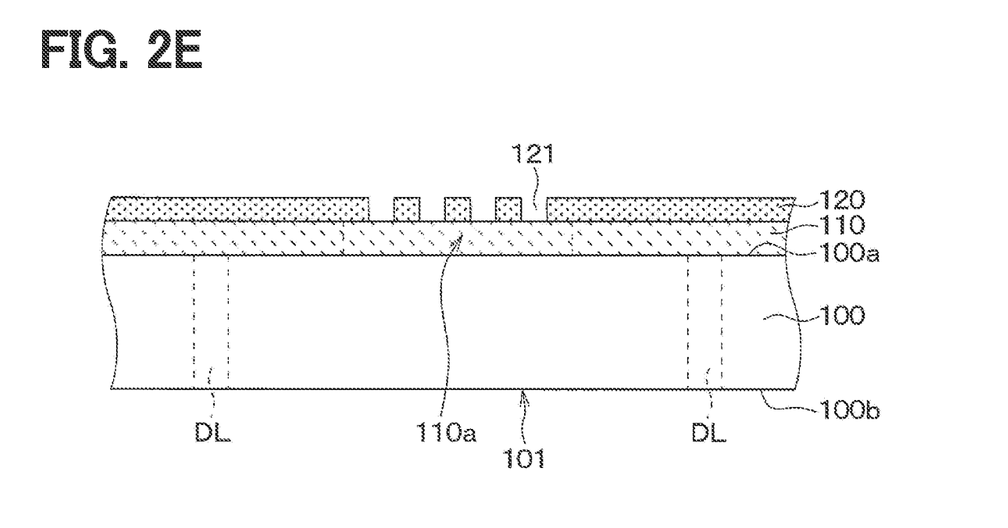
FIG. 2E is a cross-sectional view showing a manufacturing process for the ultrasonic sensor following FIG. 2D.

Then, as shown in FIG. 2E, the resist 120 is developed to form the openings 121 in the resist 120. Hereinafter, the ratio of a region of the resist 120 that is located on the piezoelectric film forming portion 110a and where the openings 121 are formed to the entire region of the resist 120 located on the piezoelectric film forming portion 110a is referred to as an opening ratio of the resist 120. In this case, the opening ratio for a portion of the resist 120 located on the portion of the piezoelectric film forming portion 110a where greater tensile stress generates is greater than the opening ratio for a portion of the resist 120 located on the portion of the piezoelectric film forming portion 110a where smaller tensile stress generates. In this embodiment, since the diameter of the piezoelectric film 13 (that is, the piezoelectric film forming portion 110a) is about 1 mm, intervals between the openings 121 can be substantially small relative to the diameter of 1 μm.

Figure 2F:
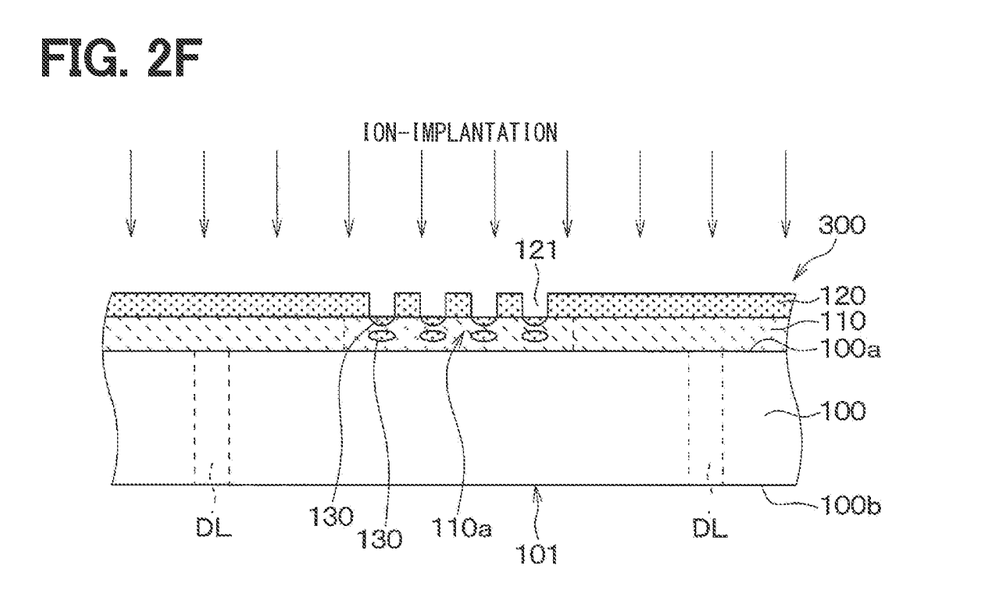
FIG. 2F is a cross-sectional view showing a manufacturing process for the ultrasonic sensor following FIG. 2E.

Thereafter, as shown in FIG. 2F, implantation regions 130 are formed in the piezoelectric film forming portion 110a by performing ion implantation using the resist 120 as a mask, and the stress in the piezoelectric film forming portion 110a is adjusted to have a desired value, and then an element forming wafer 300 is formed.

In the present embodiment, by changing acceleration voltage and performing ion implantation several times, a plurality of implantation regions 130 are formed in the piezoelectric layer 110 in a thickness direction of the piezoelectric layer 110. In this case, as the acceleration voltage increases, the injection regions 130 tend to be formed at a deeper position in the piezoelectric layer 110.

For example, in the case of ion implantation of Si (silicon), ion implantation is performed with the implantation amount of $8.00 \times 10^{12}$ atoms/cm$^3$ if the acceleration voltage is set to 10 KeV and the implantation amount of $1.60 \times 10^{13}$ atoms/cm$^3$ if the acceleration voltage is set to 25 KeV. Further, ion implantation is performed with the implantation amount of $2.80 \times 10^{13}$ atoms/cm$^3$ if the acceleration voltage is set to 50 KeV and the implantation amount of $7.60 \times 10^{13}$ atoms/cm$^3$ if the acceleration voltage is set to 100 KeV.

Furthermore, in the case of ion implantation of Mg (magnesium), ion implantation is performed with the implantation amount of $5.00 \times 10^{12}$ atoms/cm$^3$ if the acceleration voltage is set to 10 KeV and the implantation amount of $1.70 \times 10^{13}$ atoms/cm$^3$ if the acceleration voltage is set to 20 KeV. Further, ion implantation is performed with the implantation amount of $3.0 \times 10^{13}$ atoms/cm$^3$ if the acceleration voltage is set to 40 KeV and the implantation amount of $9.50 \times 10^{13}$ atoms/cm$^3$ if the acceleration voltage is set to 80 KeV.

As a result, a plurality of implantation regions 130 are formed in the piezoelectric layer 110 in the thickness direction. Note that FIG. 2F shows two implantation regions 130 formed in the thickness direction of the piezoelectric layer 110, but when ion implantation is performed with four different acceleration voltages as described above, four implantation regions 130 are formed in fact in the thickness direction of the piezoelectric layer 110. Further, the acceleration voltage may be commonly changed for all the chip forming regions 101, and does not need to be individually changed for each chip forming region 101.

Figure 4:
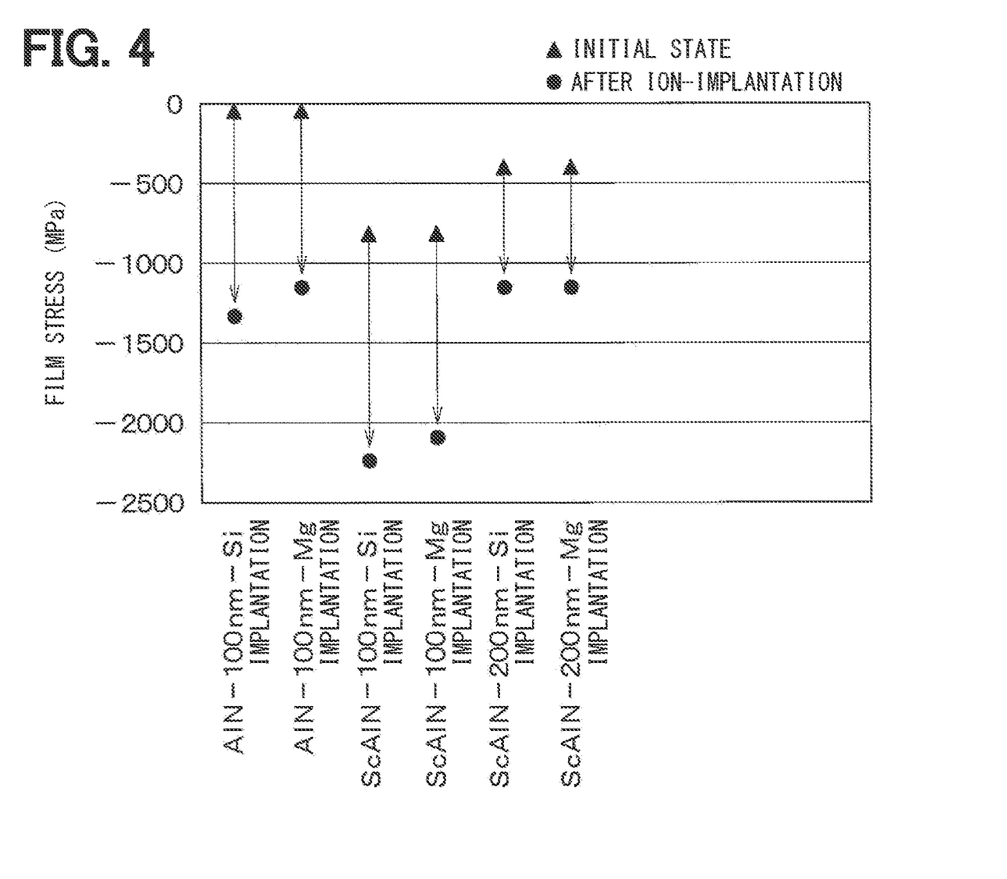
FIG. 4 is a diagram showing experimental results on the relationship between film stress of the piezoelectric layer and configuration of the piezoelectric layer.

Here, as shown in FIG. 4, the direction of the stress in the piezoelectric layer 110 changes to a compression direction by implanting ions into the piezoelectric layer 110. In FIG. 4, AlN and ScAlN are materials constituting the piezoelectric layer 110, 100 nm and 200 nm indicate the film thicknesses of the piezoelectric layer 110, and Si implantation and Mg implantation indicate the types of elements for ion-implantation.

Further, Si implantation in FIG. 4 indicates the results of ion implantation with the implantation amount of $8.00 \times 10^{12}$ atoms/cm$^3$ by setting the acceleration voltage to 10 KeV, the implantation amount of $1.60 \times 10^{13}$ atoms/cm$^3$ by setting the acceleration voltage to 25 KeV, the implantation amount of $2.80 \times 10^{13}$ atoms/cm$^3$ by setting the acceleration voltage to 50 KeV, and the implantation amount of $7.60 \times 10^{13}$ atoms/cm$^3$ by setting the acceleration voltage to 100 KeV. Similarly, Mg implantation in FIG. 4 indicates the results of ion implantation with the implantation amount of $5.00 \times 10^{12}$ atoms/cm$^3$ by setting the acceleration voltage to 10 KeV, the implantation amount of $1.70 \times 10^{13}$ atoms/cm$^3$ by setting the acceleration voltage to 20 KeV, the implantation amount of $3.00 \times 10^{13}$ atoms/cm³ by setting the acceleration voltage to 40 KeV, and the implantation amount of $9.50 \times 10^{13}$ atoms/cm³ by setting the acceleration voltage to 80 KeV. The same conditions apply to Si implantation and Mg implantation in FIGS. 5 and 6 described later.

In this case, when the film thickness is 100 nm, the stress changes by about 1.2 Gpa in the compression direction by performing ion implantation. The stress changes by about 600 MPa in the compression direction when the film thickness is 200 nm. Accordingly, it is assumed that the stress would be changed by about 100 MPa in the compression direction if the film thickness is about 1 μm. That is, when the film thickness of the piezoelectric layer 110 is about 1 μm, even if a stress distribution with the difference of several tens to 100 Mpa between the maximum value and the minimum value generates, the difference between the maximum value and the minimum value can be sufficiently reduced by performing ion implantation.

Figure 5:
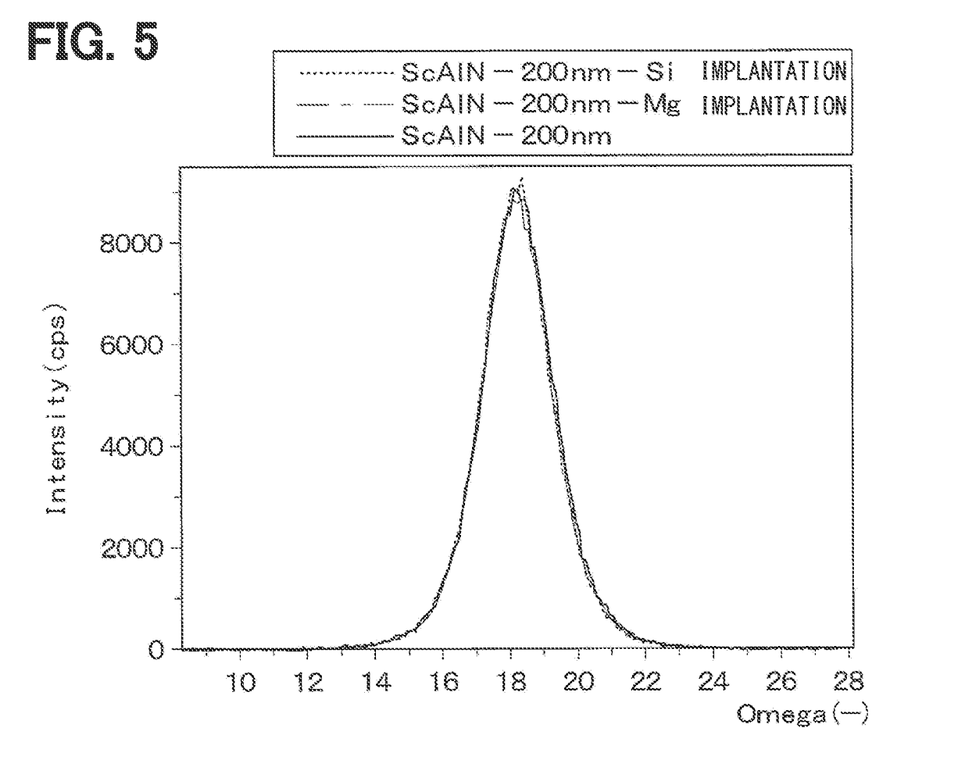
FIG. 5 is a diagram showing the results of X-ray diffraction measurement.
Figure 6:
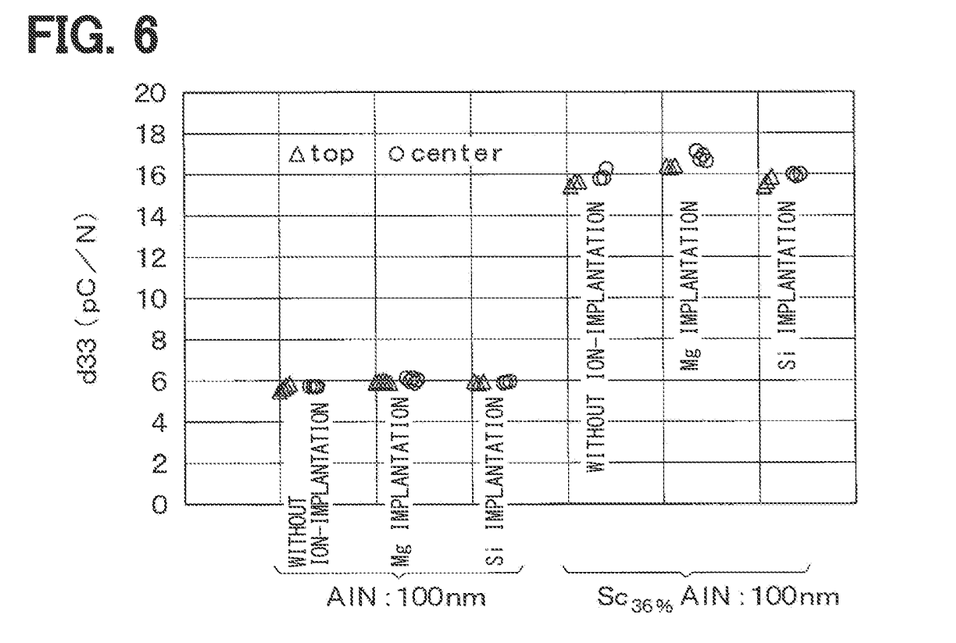
FIG. 6 is a diagram showing experimental results on the relationship between the characteristics of the piezoelectric layer and the configuration of the piezoelectric layer.

Further, even though ions are implanted into the piezoelectric layer 110, the crystallinity and the piezoelectricity are almost unchanged as shown in FIGS. 5 and 6. In addition, FIG. 5 shows an experimental result obtained by w scan on the (0002) plane in the X-ray diffraction measurement. Further, "center" in FIG. 6 is the result on a portion of the piezoelectric layer 110 located on the center of the semiconductor wafer 100, and "top" is the result on a portion of the piezoelectric layer 110 located on the outer edge of the semiconductor wafer 100. "d33" in FIG. 6 indicates a piezoelectric constant. FIG. 6 shows a result when the piezoelectric layer 110 is formed on a 6-inch semiconductor wafer 100.

As shown in the results, using the resist 120, as a mask, in which the openings 121 are formed as described above, a larger amount of ions are implanted into the portion of the piezoelectric film forming portion 110a with greater tensile stress than the portion of the piezoelectric film forming portion 110a with smaller stress. Thus, large stress in the compression direction applies to the portion of the piezoelectric film forming portion with greater tensile. Therefore, in the stress distribution in the piezoelectric film forming portion 110a, the difference between the maximum value and the minimum value can be reduced and thus can be made uniform. When ion implantation is performed, it is not necessary to change exposure time or the like for each of the piezoelectric film forming portions 110a of each chip forming region 101.

Further, as described above, the crystallinity and piezoelectricity do not change even though ion implantation is performed. However, when ion implantation is performed, a material having the same group number as the material forming the piezoelectric layer 110 may be preferably ion-implanted. For example, when the piezoelectric layer 110 is made of AlN, since Al is Group 3B and N is Group 5B, it is preferable to ion-implant elements of Group 3B or Group 5B. Further, for example, when the piezoelectric layer 110 is made of ScAlN, since Sc is Group 3A, Al is Group 3B, and N is Group 5B, it is preferable to ion-implant elements of Group 3A, Group 3B or Group 5B. As a result, since the element having the same group number as the element forming the piezoelectric layer 110 is ion-implanted, it is also possible to suppress change in conductivity. Therefore, when performing ion implantation, it is preferable to implant a material having the same group number as the material forming the piezoelectric layer 110.

Next, although not particularly shown, heat treatment is performed. At this time, it is also possible to make local stress in the piezoelectric film forming portion 110a uniform because of diffusion of the implanted ions.

Figure 2G:
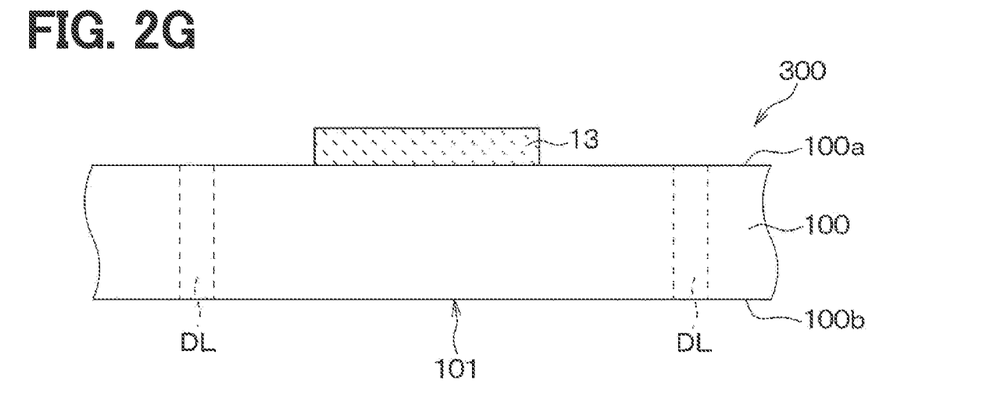
FIG. 2G is a cross-sectional view showing a manufacturing process for the ultrasonic sensor following FIG. 2F.

Subsequently, as shown in FIG. 2G, a resist (not shown) is placed on the piezoelectric layer 110 and the resist is patterned. Then, dry etching or the like is performed using the resist as a mask, and the piezoelectric layer 110 is patterned to form the piezoelectric film 13.

Figure 2H:
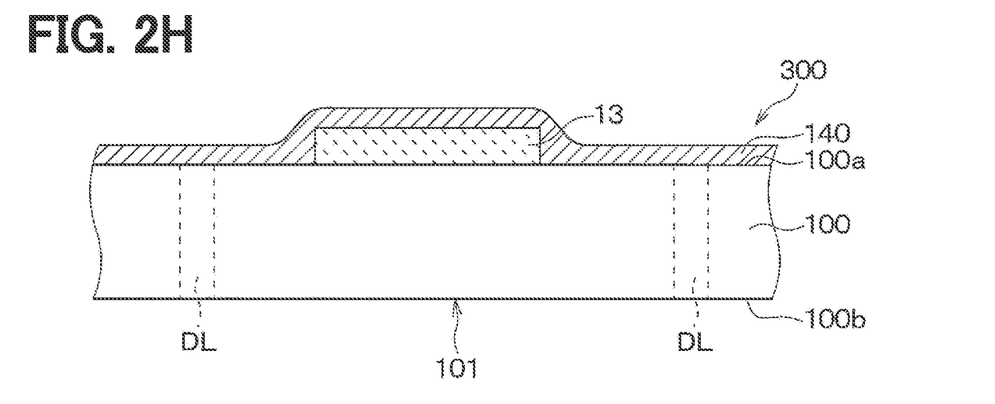
FIG. 2H is a cross-sectional view showing a manufacturing process for the ultrasonic sensor following FIG. 2G.
Figure 2I:
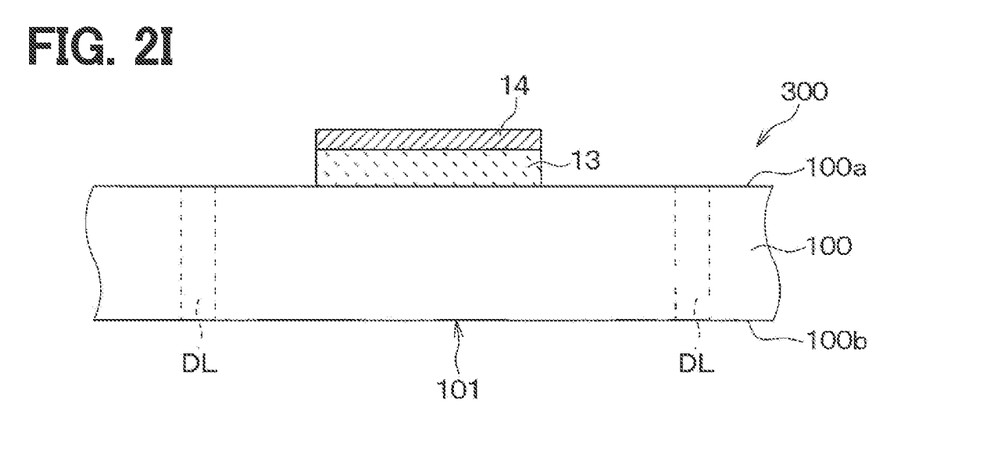
FIG. 2I is a cross-sectional view showing a manufacturing process for the ultrasonic sensor following FIG. 2H.

Next, as shown in FIG. 2H, the electrode layer 140 is formed to cover the piezoelectric film 13 by a sputtering method or the like. Then, as shown in FIG. 2I, a resist (not shown) is placed on the electrode layer 140 and the resist is patterned. Thereafter, dry etching or the like is performed using the resist as a mask, and the electrode layer 140 is patterned to form the electrode film 14.

After that, although not particularly shown, an ultrasonic sensor is formed by forming the recess 11 from the other surface 100b of the semiconductor wafer 100 to form the diaphragm portion 12 and by dividing the diaphragm portion 12 along the dicing lines DL.

As described above, in the present embodiment, the opening ratio of the resist 120 is changed by changing the opening ratio of the exposure adjustment portion 200a in the photomask 200. Then, ions are implanted using the resist 120 as a mask so that an amount of ions according to the opening ratio of the resist 120 is implanted to generate stress uniformly in the piezoelectric film forming portion 110a of each chip forming region 101. Therefore, it is not necessary to finely control an exposure time and the like during ion implantation, and thus the manufacturing process can be simplified.

Further, in the present embodiment, a material in the same group as the material forming the piezoelectric layer 110 is ion-implanted. Therefore, it is possible to suppress change in the conductivity of the piezoelectric layer 110.

Further, in the present embodiment, ion implantation is performed only on the piezoelectric film forming portion 110a. Therefore, it is possible to effectively utilize a region other than the piezoelectric film forming portion 110a.

Further, when ion implantation is performed, the acceleration voltage is changed and ion implantation is performed a plurality of times so that a plurality of injection regions 130 are formed in the thickness direction of the piezoelectric film forming portion 110a. Therefore, it is possible avoid generating stress locally and unevenly in the thickness direction of the piezoelectric film forming portion 110a.

Modification to the First Embodiment

Figure 7:
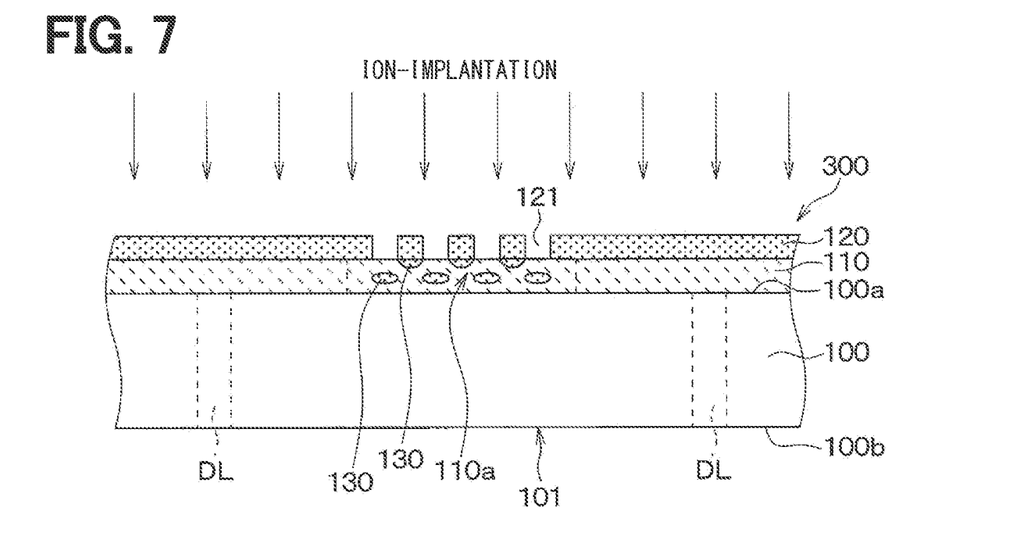
FIG. 7 is a cross-sectional view showing a state of ion implantation according to a modification to the first embodiment.
Figure 8:
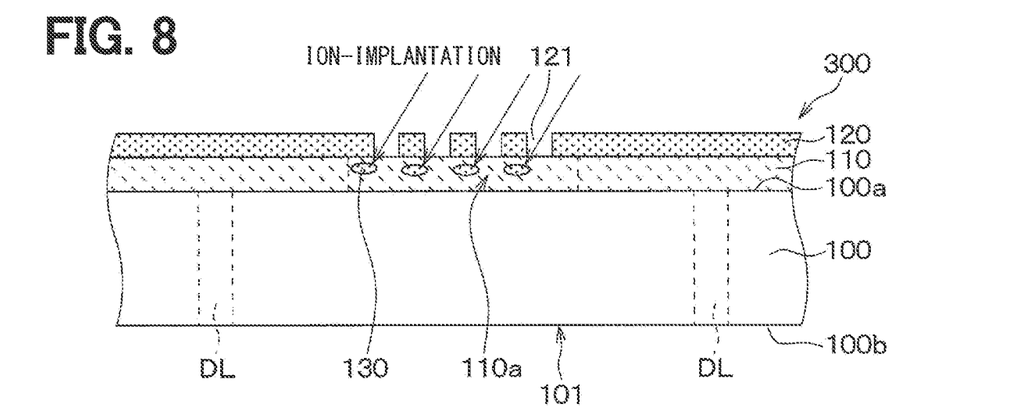
FIG. 8 is a cross-sectional view showing a state of ion implantation according to a second embodiment.

A modification to the above-described first embodiment will be described hereafter. When the acceleration voltage is changed and ion implantation is performed plural times during the process of FIG. 2F, the patterning of the openings 121 of the resist 120 may be changed each time the ion implantation is performed, as shown in FIG. 7. Note that FIG. 8 shows an example where the acceleration voltage is changed to perform ion implantation twice. Specifically, the first ion implantation is performed so that implantation regions 130 are formed at positions located directly below the resist 120, and then a second ion implantation is performed using the resist 120 in the figure as a mask. Accordingly, it is also possible to avoid generating stress locally and unevenly in the in-plane direction of the piezoelectric film forming portion 110a.

Second Embodiment

A second embodiment will be described. In this embodiment, a direction for ion implantation is added to the first embodiment. Descriptions of the same configurations and processes as those of the first embodiment will not be repeated hereinafter.

In the present embodiment, when the ion implantation in FIG. 2F is performed, as shown in FIG. 8, ions are also implanted in a direction intersecting the normal direction to the one surface 100a of the semiconductor wafer 100. In this case, the thinner the film thickness of the resist 120, the smaller the region where the resist 120 blocks ions from being implanted. Therefore, the opening ratio of the resist 120 (that is, the opening ratio of the exposure adjustment portion 200a) is preferably set in consideration of the effectiveness of ion implantation in a tilted direction.

It should be noted that in FIG. 8, the implantation regions 130 formed at positions exposed through the openings 121 of the piezoelectric film forming portion 110a and the implantation regions 130 formed at different positions in the thickness direction of the piezoelectric film forming portion 110a are not illustrated.

Accordingly, it is possible to reduce the region of the piezoelectric film forming portion 110a where ion implantation is prevented by the resist 120 by additionally performing ion implantation in a tilted direction. That is, the implantation regions 130 can also be formed at positions in the piezoelectric film forming portion 110a located directly below the resist 120. Therefore, it is possible to avoid generating stress locally and unevenly in the piezoelectric film forming portion 110a.

Third Embodiment

A third embodiment will be described. In this embodiment, a plurality of diaphragm portions 12 are formed in addition to the configuration described in the first embodiment. Descriptions of the same configurations and processes as those of the first embodiment will not be repeated hereinafter.

Figure 9:
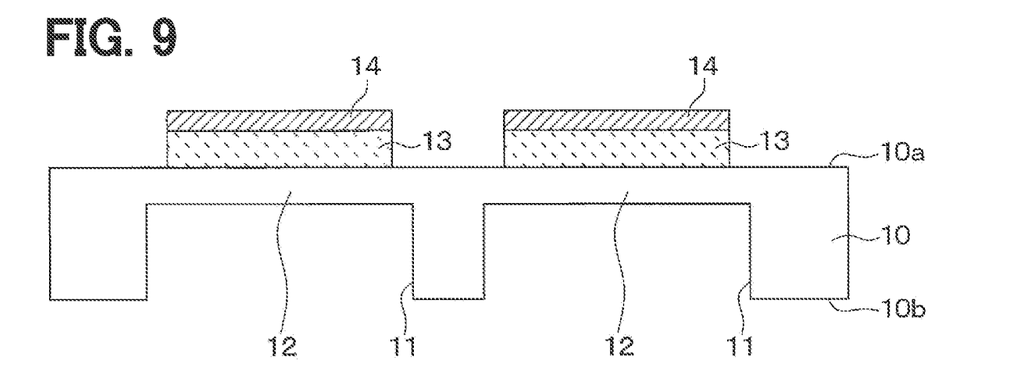
FIG. 9 is a cross-sectional view of an ultrasonic sensor according to a third embodiment.

As shown in FIG. 9, in the ultrasonic sensor of the present embodiment, two diaphragm portions 12 are formed by forming two recesses 11 in the semiconductor substrate 10. A piezoelectric film 13 and an electrode film 14 are sequentially formed on the diaphragm portion 12 for each diaphragm portion.

Further, in the present embodiment, each of the piezoelectric films 13 located on the corresponding diaphragm portion 12 has a different value of stress from each other. That is, each piezoelectric film 13 has a different resonance frequency. Therefore, for example, when this ultrasonic sensor is used in a transmitter, since the resonance frequencies of the piezoelectric films 13 are different from each other, it is possible for the transmitter to easily transmit different transmission waves.

In such an ultrasonic sensor, an amount of ions implanted into the piezoelectric film forming portion 110a constituting each piezoelectric film 13 is adjusted based on the stress distribution of each piezoelectric layer 110 at the processes of FIGS. 2D to 2F. For example, by forming the piezoelectric layer 110, two piezoelectric film forming portions 110a are formed in a single chip forming region 101. Therefore, when the piezoelectric layer 110 is formed, for example, if stress in one piezoelectric film forming portion 110a and stress in the other piezoelectric film forming portion 110a are the same in a single chip forming region 101, different amounts of ions are implanted into the piezoelectric film forming portions 110a. That is, at the process of FIG. 2D, the opening ratio of the exposure adjustment portion 200a may be adjusted as the photomask 200 such that an exposure amount for a portion of the resist 120 located on one of the piezoelectric film constituent portions 110a and an exposure amount for a portion of the resist 120 located on the other of the piezoelectric film constituent portions 110a differ from each other.

As described above, even though the ultrasonic sensor has a plurality of piezoelectric films 13, the same advantages as those of the first embodiment can be obtained. Although the stress of each piezoelectric film 13 is different in the above-described example, the stress of each piezoelectric film 13 may be the same.

Fourth Embodiment

A fourth embodiment will be described. In this embodiment, ions are implanted into the electrode layer 140 as compared to the first embodiment. Descriptions of the same configurations and processes as those of the first embodiment will not be repeated hereinafter.

Figure 10:
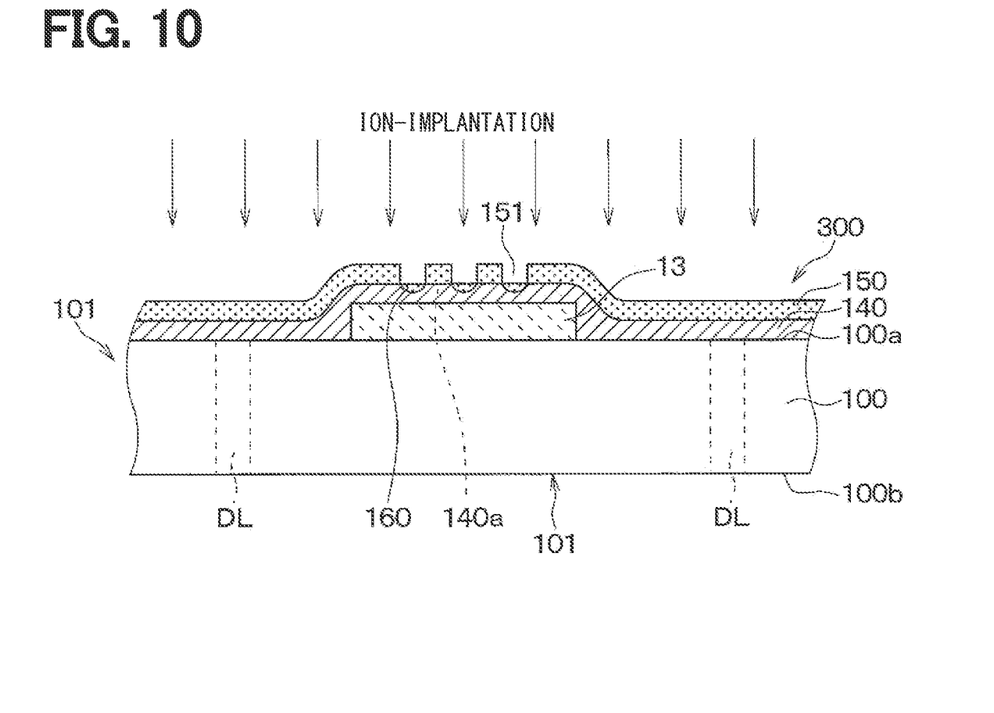
FIG. 10 is a cross-sectional view showing a state of ion implantation according to a fourth embodiment.

First, in this embodiment, ion implantation is not performed on the piezoelectric layer 110. In the present embodiment, as shown in FIG. 10, after the electrode layer 140 is formed, stress in the electrode film forming portion 140a is adjusted to have a desired value by implanting ions into the electrode film forming portion 140a constituting the electrode film 14 in the electrode layer 140. In this embodiment, the electrode layer 140 corresponds to a thin layer, and the electrode film forming portion 140a corresponds to an element forming portion.

Specifically, ions are implanted into the electrode film forming portion 140a in a same manner as the above-described method for ion implantation into the piezoelectric film forming portion 110a. That is, after forming the electrode layer 140, the resist 150 is placed on the electrode layer 140. Then, based on the stress distribution, openings 151 are formed in the resist 150 using a photomask 200 whose opening ratio is adjusted so that the stress of the electrode film forming portion 140a has a desired value, and ion implantation is performed using the resist 150 as a mask to form the implantation region 160.

In this case, since ion implantation is not performed on the piezoelectric layer 110 in the present embodiment, the piezoelectric layer 110 is in a state where non-uniform stress generates in the in-plane direction. Then, in the present embodiment, the overall stress distribution between the piezoelectric layer 110 and the electrode layer 140 has been obtained in advance, and the stress in the electrode film forming portion 140a is set to have a desired value, whereby the entire stress over the piezoelectric film forming portion 110a and the electrode film forming portion 140a has a desired value.

Note that FIG. 10 shows a diagram in which only a single implantation region 160 is formed in the thickness direction of the electrode layer 140, but when the acceleration voltage is changed and ion implantation is performed several times, a plurality of implantation regions 160 are formed in the thickness direction of the electrode layer 140.

As described above, even if the ion implantation is performed in the electrode layer 140, the same advantages as those of the first embodiment can be obtained. Although the ion implantation is not performed on the piezoelectric layer 110 in the above-described present embodiment, the ion implantation may be performed on the electrode layer 140 after the ion implantation is performed on the piezoelectric layer 110.

Fifth Embodiment

A fifth embodiment will be described. In this embodiment, stepper-exposure is performed on the resist 120 as compared to the first embodiment. Descriptions of the same configurations and processes as those of the first embodiment will not be repeated hereinafter.

In each of the above embodiments, a method for fixing the photomask 200 and performing aligner exposure to the resist 120 has been described. Alternatively, when exposing the resist 120, stepper exposure may be performed while moving the photomask 200 and the semiconductor wafer 100.

Figure 11:
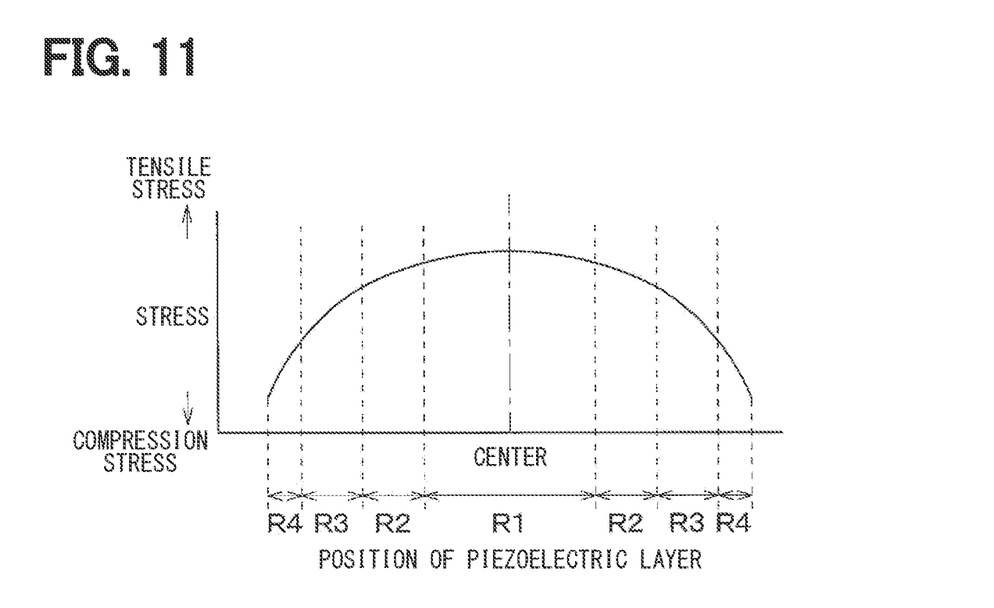
FIG. 11 is a schematic diagram showing a stress distribution in a thin layer before ion implantation is performed according to the fifth embodiment.

For example, as shown in FIG. 11, when the piezoelectric layer 110 is formed on one surface 100a of the semiconductor wafer 100, tensile stress generates in a portion of the piezoelectric layer 110 located on the center of the semiconductor wafer 100, and compression stress generates in a portion of the piezoelectric layer 110 located on the outer edge portion of the semiconductor wafer 100. Then, it is assumed that the stress gradually changes from the portion located on the center of the semiconductor wafer 100 toward the portion located on the outer edge portion of the semiconductor wafer 100. Note that FIG. 11 is a schematic diagram continuously showing the stress generated in the piezoelectric film forming portion 110a in each chip forming region 101. Further, FIG. 11 shows stress distribution that extends in one direction of the in-plane direction and passes through a portion of the piezoelectric layer 110 located on the center of the semiconductor wafer 100. The stress distribution shows the stress at each region of FIG. 12, which will be described later.

Figure 12:
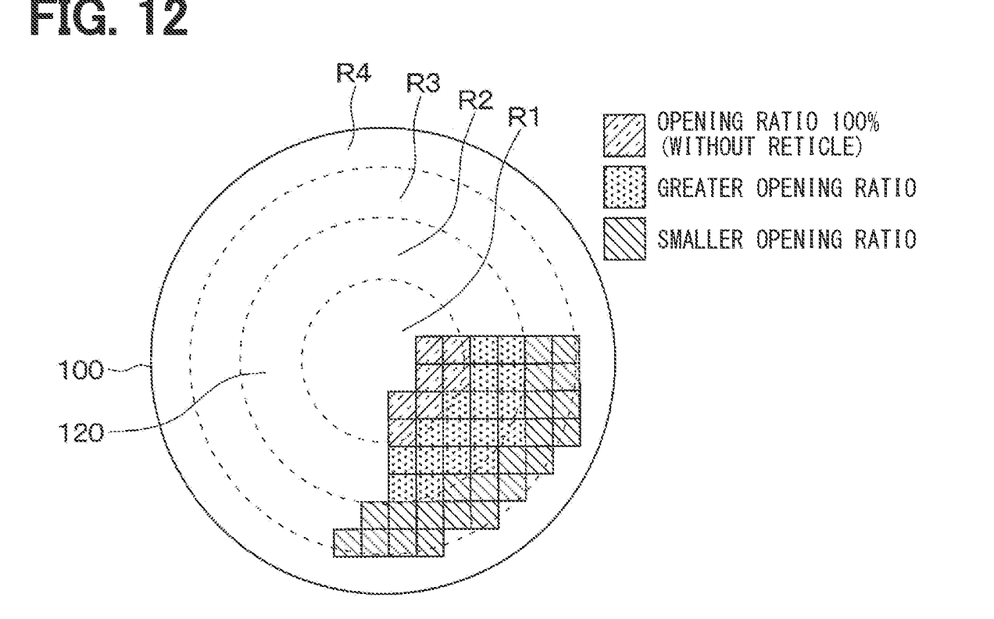
FIG. 12 is a schematic diagram showing the opening ratio of a reticle used for stepper-exposure according to a sixth embodiment.

For example, as shown in FIG. 12, in the piezoelectric layer 110, a circular region including the center of the semiconductor wafer 100 is defined as a first region R1, and annular regions concentric with the first region R1 are defined as a region R2, a third region R3, and a fourth region R4 in this order.

Then, when exposing the resist 120 to light at the process of FIG. 2D, for example, two types of reticles having different opening ratios of the exposure adjustment portions 200a are prepared as a photomask 200. Then, the resist 120 is subject to stepper-exposure using the two types of reticles. Specifically, for the first region R1, light exposure is performed to the resists 120 without using a reticle. That is, in the process of FIG. 2E, the resist 120 in the first region R1 is entirely removed.

Then, for the second region R2 and the third region R3, light exposure is performed to the resist 120 using reticles with the opening ratios of the exposure adjustment portions 200a decreasing from the reticle for the second region R2 to the reticle for the third region R3. That is, the resist 120 is exposed such that the opening ratio of a portion of the resist 120 located on the piezoelectric film forming portion 110a in the second region R2 is greater than the opening ratio of a portion of the resist 120 located on the piezoelectric film forming portion 110a in the third region R3. Further, the fourth region R4 is not exposed in this embodiment. As a result, when the process of FIG. 2E is performed, the openings 121 are formed in the resist 120 with the opening ratios that decrease step-by-step for the first region R1, the second region R2, and the third region R3 in this order. Further, the openings 121 are not formed in the fourth region R4.

Figure 13:
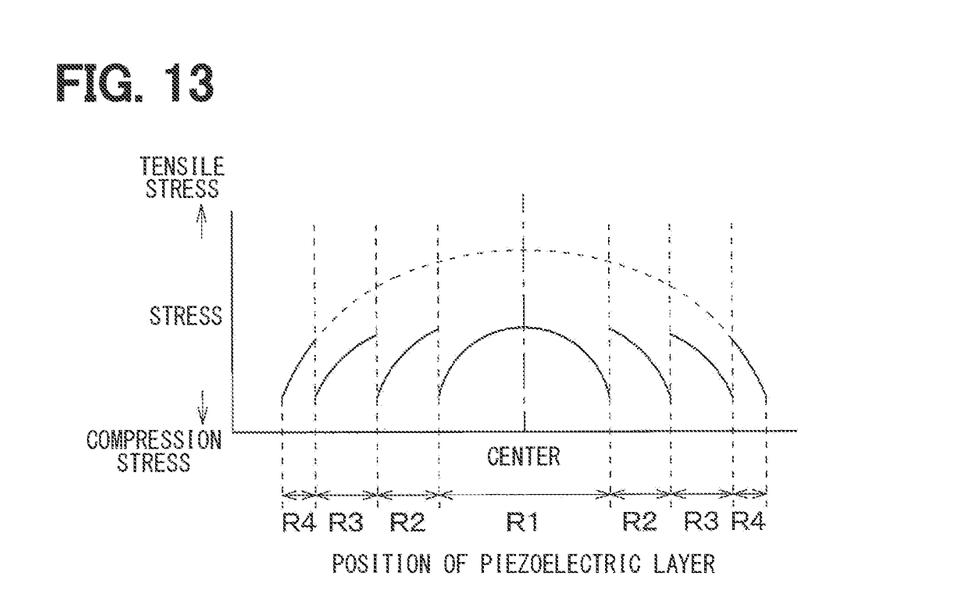
FIG. 13 is a schematic diagram showing a stress distribution in the thin layer after ion implantation is performed according to a seventh embodiment.

By performing ion implantation using the resist 120, stress distribution in the piezoelectric layer 110 has a so-called wave shape, in other words, a saw blade shape, as shown in FIG. 13. Note that FIG. 13 shows the stress distribution that extends in one direction along the in-plane direction and passes through the center of the semiconductor wafer 100. FIG. 13 continuously shows stress generating across the piezoelectric film forming portions 110a in each chip forming region 101.

Specifically, the piezoelectric layer 110 passes through the center of the semiconductor wafer 100 and has the first to fourth regions R1 to R4 in one direction along the in-plane direction of the semiconductor wafer 100. A plurality of piezoelectric film forming portions 110a are arranged in the regions R1 to R4. The stress distribution in the plurality of piezoelectric film constituent portions 110a arranged in the regions R1 to R4 is described as follows. The stress distribution has maximum and minimum stresses in each region R1 to R4, and the rate of change (that is, a slope) between the maximum and minimum stresses in each region R1 to R4 is less than the rate of change in stress at the boundary between the adjacent regions. The rate of change is defined as a ratio of the difference in stress between the maximum value and the minimum value to the distance between the maximum point and the minimum point. For example, in the region R3 shown in FIG. 13, the rate of change between the maximum and the minimum stress is less than the rate of change in stress at the boundary between the region R3 and the region R2.

Further, in the present embodiment, since the resist 120 is stepper-exposed using two types of reticles, the stress generated in the piezoelectric film forming portion 110a can be divided into four elements.

As described above, when the resist 120 is stepper-exposed, the same advantages as those of the first embodiment can be obtained. Further, when a plurality of reticles are prepared as the photomask 200, the following advantages can be obtained. Specifically, when a portion of the stress distribution changes due to change over time in the film forming device or the like, by changing a divided structure of each region (i.e., the shot map) or replacing the reticle corresponding to the changed part with new one, it is possible to easily address changes over time.

In the above description, two types of reticles have been used, but the type of reticle can be changed as appropriate. That is, assuming that an integer of 1 or more is N, the stress distribution of the piezoelectric layer 110 can be divided into (N+2) elements by using N types of reticles having different opening ratios of the exposure adjustment portions 200a.

OTHER EMBODIMENTS

Although the present disclosure has been described in accordance with the embodiments, it is understood that the present disclosure is not limited to such embodiments or structures. The present disclosure encompasses various modifications and variations within the scope of equivalents. In addition, various combinations and modes, and other combinations and modes including only one element, more elements, or less elements are also within the scope and idea of the present disclosure.

For example, in each of the above embodiments, the diaphragm portion 12 may have a polygonal shape instead of a circular shape. Further, in each of the above embodiments, the recess 11 may not be formed and the diaphragm portion 12 may not be provided.

In the first to third embodiments, tensile stress is generated in the piezoelectric layer 110. However, the present disclosure may apply to a situation where compression stress generates in the piezoelectric layer 110. When such compression stress generates in the piezoelectric layer 110, the opening ratio of the photomask 200 may be set in a pattern opposite to the above-described embodiments. That is, by implanting ions into the piezoelectric layer 110, compression stress is applied to the piezoelectric layer 110. Therefore, when compression stress is generated in the piezoelectric layer 110, and if it is desired to equalize the compression stress of each piezoelectric film forming portion 110a, the opening ratio of the photo mask 200 may be adjusted such that a larger amount of ions are implanted into a portion where smaller compression stress generates than a portion where larger compressive stress generates. Similarly, also in the fourth embodiment, if the opening ratio of the photomask 200 is adjusted so that the amount of ions to be implanted into the electrode film forming portion 140a is adjusted according to the stress generated in the electrode layer 140.

Figure 14A:
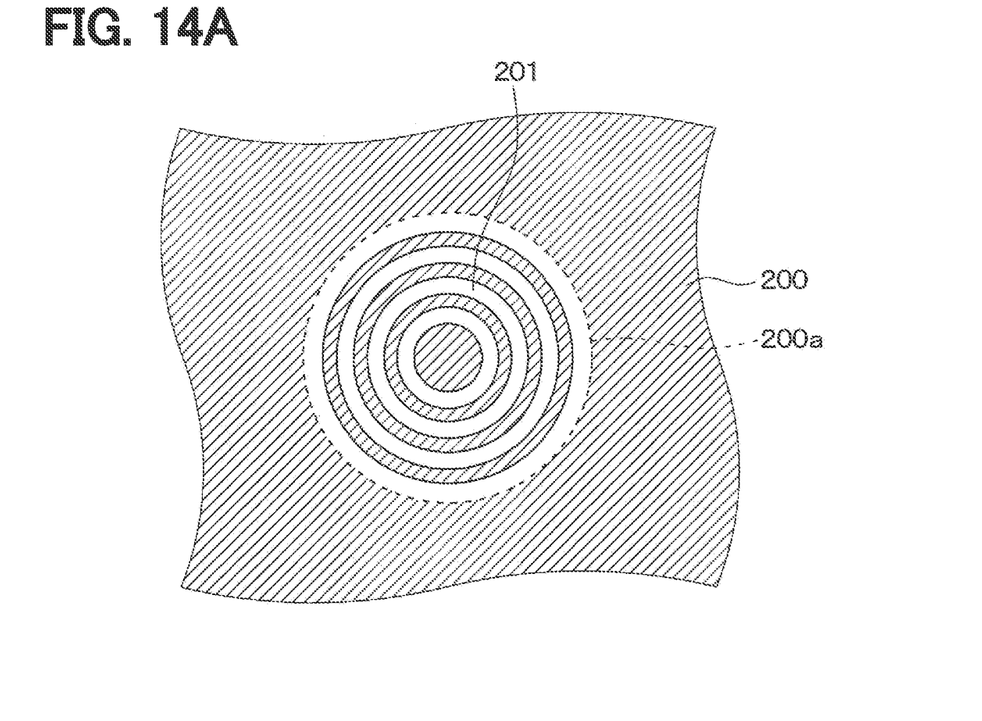
FIG. 14A is a plan view of a photomask according to another embodiment.
Figure 14B:
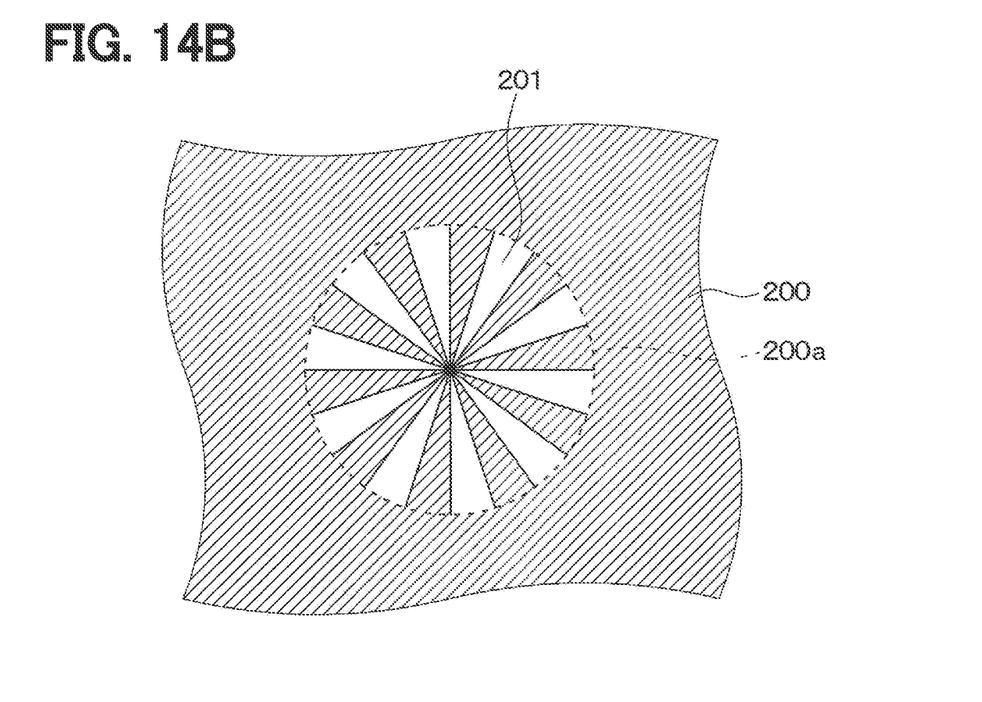
FIG. 14B is a plan view of a photomask according to yet another embodiment.

Further, in each of the above embodiments, the shape of the opening 201 in the photomask 200 may be changed. For example, as shown in FIG. 14A, the photomask 200 may have openings 201 formed concentric with each other. Furthermore, as shown in FIG. 14B, the photomask 200 may be formed so that the openings 201 extends radially from the center of the exposure adjustment portion 200a. However, it is preferable that the photomask 200 has a plurality of openings 201 in consideration of misalignment and the like. For example, when the opening ratio of the exposure adjustment portion 200a is 50%, the 50% opening ratio should not be achieved by a single opening 201 but be achieved by the plurality of openings 201. In this case, it is preferable that the opening 201 has a regularity shape such as n-time symmetry with respect to the center of the exposure adjustment portion 200a (where n is an integer of 2 or more). Although FIGS. 14A and 14B do not show a cross-sectional view, hatching is applied to a portion different from the openings 201 of the photomask 200 for easy understanding purposes.

Further, in each of the above embodiments, heat treatment may not be performed after the implanted region 130 was formed. Even in such a manufacturing method, the piezoelectric layer 110 has a desired stress distribution by implanting ions.

Further, in each of the above embodiments, the thin layer is not necessarily formed of the piezoelectric layer 110 and the electrode layer 140, and may be made of another material.

The embodiments described above can also be combined with each other. For example, the second embodiment may be combined with the third to fifth embodiments so that ion implantation may be performed from a direction inclined from the normal direction. The third embodiment may be combined with the fourth and fifth embodiments to provide a method for manufacturing an element-forming wafer 300 that constitutes an ultrasonic sensor having a plurality of piezoelectric films 13. The fourth embodiment may be combined with the fifth embodiment, and ion implantation may be performed in the electrode film forming portion 140a. Further, the combination of the above embodiments may be further combined, and the combination manner can be appropriately changed.

The invention claimed is:

1. An element forming wafer, comprising:
a semiconductor wafer having a plurality of chip forming regions; and
a thin layer formed on the semiconductor wafer, wherein
a plurality of portions of the thin layer each of which forms an element in each of the plurality of chip forming portions are defined as a plurality of element forming portions,
a plurality of regions are formed in the thin layer in one direction that passes through a center of the semiconductor wafer and that extends along an in-plane direction of the semiconductor wafer,
each of the plurality of element forming portions is arranged in a respective one of the plurality of regions,
a stress distribution that is along the one direction and is generated across the plurality of element forming portions has a maximum and a minimum of the stress in each of the plurality of regions, and
a rate of change in the stress between the maximum and the minimum in each of the plurality of regions is smaller than a rate of change in the stress at a boundary between adjacent ones of the plurality of regions.

2. The element forming wafer according to claim 1, wherein
the thin layer is formed of a piezoelectric layer, and
the piezoelectric layer has an implantation region into which an element having a same group number as that of an element constituting the piezoelectric layer is implanted.

* * * * *